(12) United States Patent
Chiu et al.

(10) Patent No.: US 9,953,930 B1
(45) Date of Patent: Apr. 24, 2018

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Ying-Ta Chiu, Kaohsiung (TW);
Chiu-Wen Lee, Kaohsiung (TW);
Dao-Long Chen, Kaohsiung (TW);
Po-Hsien Sung, Kaohsiung (TW);
Ping-Feng Yang, Kaohsiung (TW);
Kwang-Lung Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/299,236

(22) Filed: Oct. 20, 2016

(51) Int. Cl.
*H01L 21/00* (2006.01)
*H01L 23/10* (2006.01)
*H01L 23/552* (2006.01)

(52) U.S. Cl.
CPC ............ *H01L 23/552* (2013.01); *H01L 23/10* (2013.01)

(58) Field of Classification Search
CPC .............................. H01L 23/552; H01L 23/10
USPC .................. 438/121–127; 257/704, 710, 790
See application file for complete search history.

(56) References Cited

U.S. PATENT DOCUMENTS

| | | | |
|---|---|---|---|
| 5,233,225 A * | 8/1993 | Ishida | .................. H01L 21/565 257/774 |
| 6,600,101 B2 | 7/2003 | Mazurkiewicz | |
| 6,818,821 B2 * | 11/2004 | Fujieda | .................. B82Y 10/00 174/394 |
| 7,224,052 B2 * | 5/2007 | Nishizawa | ............. G06K 19/07 257/679 |
| 7,436,054 B2 * | 10/2008 | Zhe | ....................... B81C 1/0023 257/686 |
| 7,772,684 B2 * | 8/2010 | Kuramochi | ......... H01L 21/6835 257/678 |
| 8,018,033 B2 | 9/2011 | Moriya | |
| 8,729,682 B1 | 5/2014 | Davis et al. | |
| 2011/0248389 A1 * | 10/2011 | Yorita | ................. H01L 23/3677 257/659 |
| 2013/0247977 A1 | 9/2013 | Kumai et al. | |

\* cited by examiner

*Primary Examiner* — Calvin Lee
(74) *Attorney, Agent, or Firm* — Foley & Lardner LLP; Cliff Z. Liu

(57) ABSTRACT

A semiconductor package structure includes a substrate, a semiconductor element, an encapsulant, an adhesion layer and a metal cap. The semiconductor element is disposed on the substrate. The encapsulant covers the semiconductor element. The adhesion layer is disposed on the encapsulant. The metal cap is attached to the encapsulant by the adhesion layer, and the metal cap is conformal with the encapsulant.

18 Claims, 11 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a semiconductor process, and more particularly to a semiconductor package structure with electromagnetic interference (EMI) shielding capability and a method for manufacturing the same.

2. Description of the Related Art

A conventional semiconductor package structure includes at least one electrical device and a solid molding compound encapsulating the electrical element. Although the molding compound is an electrically insulating material, the semiconductor package structure may suffer from EMI caused by an adjacent electrical device. For example, integrated circuits are often a source of EMI, since they couple their energy to larger objects such as heatsinks, circuit board planes and cables to radiate significantly. If EMI occurs, the semiconductor package structure does not operate normally and efficiently. This is because EMI is a disturbance that affects an electrical circuit due to electromagnetic induction or electromagnetic radiation emitted from an external source. Thus, EMI resistance or shielding is desired.

SUMMARY

In one aspect according to some embodiments, a semiconductor package structure includes a substrate, a semiconductor element, an encapsulant, an adhesion layer and a metal cap. The semiconductor element is disposed on the substrate. The encapsulant covers the semiconductor element. The adhesion layer is disposed on the encapsulant. The metal cap is attached to the encapsulant by the adhesion layer, and the metal cap is conformal with the encapsulant.

In another aspect according to some embodiments, a method for manufacturing a semiconductor package structure includes: (a) providing a substrate with a semiconductor element disposed thereon; and (b) providing an encapsulant, an adhesion layer and a metal cap to form the semiconductor package structure, wherein the encapsulant covers the semiconductor element, the adhesion layer is disposed on the encapsulant, the metal cap is attached to the encapsulant by the adhesion layer, and the metal cap is conformal with the encapsulant.

DETAILED DESCRIPTION

In order to enhance EMI resistance or shielding, a composite material (including metal particles and a resin) may be coated on a surface of a molding compound of a semiconductor package structure. However, an adhesion between the composite material and the molding compound is low, and the composite material has poor EMI shielding capability when shielding high frequency electromagnetic waves (e.g., higher than about 300 MHz). In addition, heat dissipation capability of the composite material is low.

To address such concern, a metal layer may be plated or sputtered on a surface of a molding compound of a semiconductor package structure. However, the metal layer is typically a single layer, and options for metals are constrained because some metals do not have suitable corresponding plating solutions. For example, iron, 45# steel, stainless steel and permalloy do not have suitable corresponding plating solutions to perform a plating or sputtering process. Further, it may be difficult to control an uniformity of a thickness of the metal layer, and the plating or sputtering process may present environmental pollution concerns. In addition, the plating or sputtering process involves time consuming procedures to form the metal layer.

To address the above concerns, embodiments of the present disclosure provide an improved semiconductor package structure and improved techniques for manufacturing the semiconductor package structure. In some embodiments, the semiconductor package structure includes an adhesion layer (e.g., a solder mask layer) for adhering a metal cap to an encapsulant of the semiconductor package structure. Thus, expanded options for a metal are available for the metal cap because the metal cap may be formed by mechanical techniques such as punching. Further, a single layer or multiple layers of metal-containing materials can be laminated to form the metal cap so as to shield high frequency electromagnetic waves (e.g., higher than about 300 MHz), low frequency electromagnetic waves (e.g., lower than about 300 MHz), or both. In addition, an uniformity of a thickness of the metal cap can be readily controlled. The method of forming the metal cap can be achieved by mechanical techniques, rather than chemical techniques such as coating, plating or sputtering, thereby presenting low environmental pollution concerns.

Figure 1:
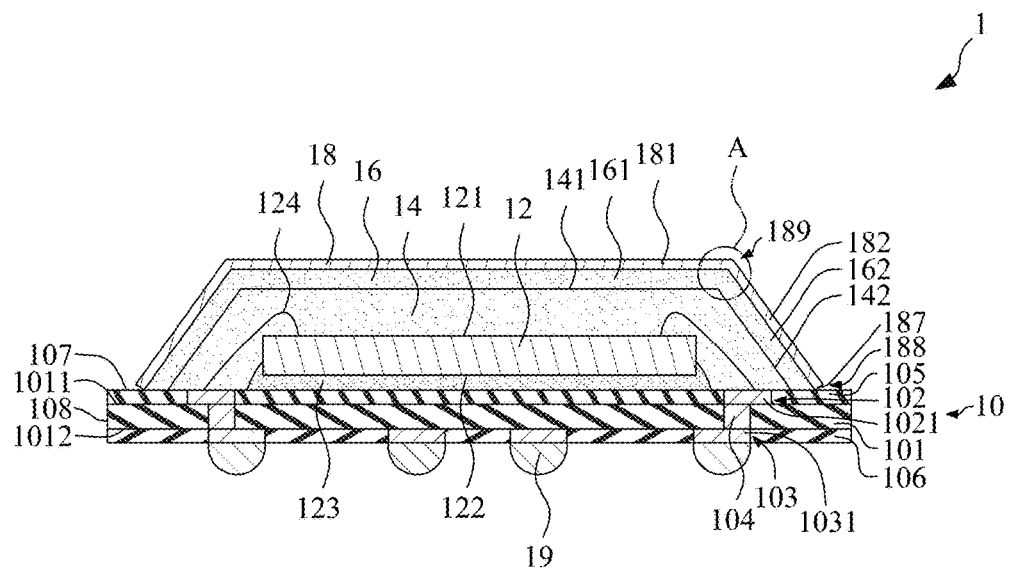
FIG. 1 illustrates a cross-sectional view of a semiconductor package structure according to some embodiments of the present disclosure.
Figure 2:
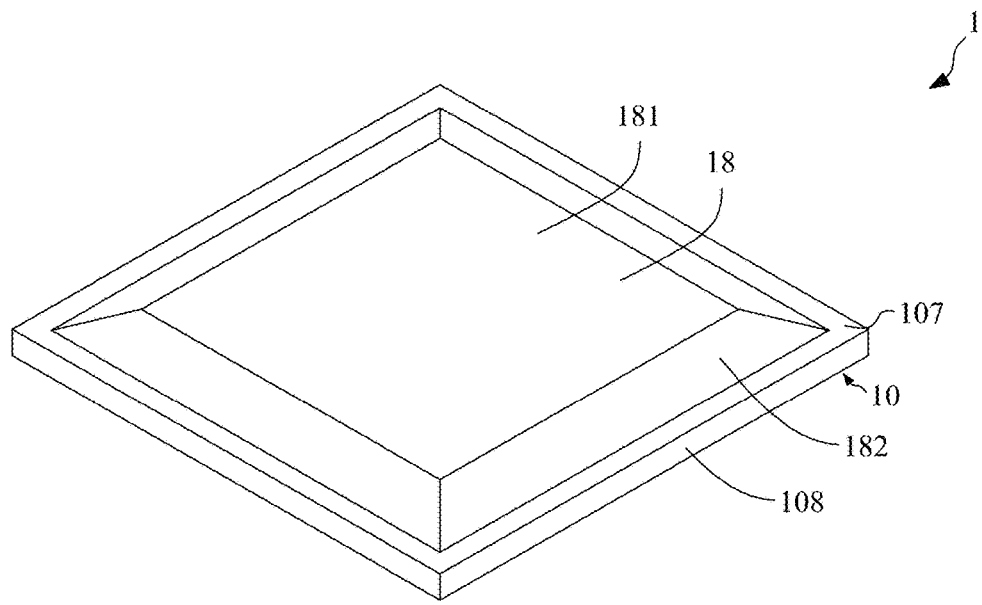
FIG. 2 illustrates a perspective view of the semiconductor package structure of FIG. 1.

FIG. 1 illustrates a cross-sectional view of a semiconductor package structure 1 according to some embodiments of the present disclosure. FIG. 2 illustrates a perspective view of the semiconductor package structure 1 of FIG. 1. The semiconductor package structure 1 includes a substrate 10, at least one semiconductor element 12, an encapsulant 14, an adhesion layer 16, a metal cap 18 and multiple solder balls 19. In one or more embodiments, the substrate 10 is a package substrate, and includes a core portion 101, a first patterned circuit 102, a second patterned circuit 103, multiple conductive vias 104, a first protection layer 105 and a second protection layer 106. The core portion 101 has a first surface 1011 (e.g., a top surface) and a second surface 1012 (e.g., a bottom surface). The first patterned circuit 102 is disposed on the first surface 1011 of the core portion 101, and includes multiple bonding pads 1021. The second patterned circuit 103 is disposed on the second surface 1012 of the core portion 101, and includes multiple ball pads 1031. Each of the conductive vias 104 extends through the core portion 101, and is electrically and physically connected to the first patterned circuit 102 and the second patterned circuit 103. The first protection layer 105 is disposed on the first surface 1011 of the core portion 101 to cover and protect the first patterned circuit 102, and exposes the bonding pads 1021. The second protection layer 106 is disposed on the second surface 1012 of the core portion 101 to cover and protect the second patterned circuit 103, and exposes the ball pads 1031. The solder balls 19 are disposed on the respective ball pads 1031 for external connection. In one or more embodiments, materials of the first protection layer 105 and the second protection layer 106 may be both a solder mask. As shown in FIG. 1, the substrate 10 has a first surface 107 and a side surface 108, wherein the first surface 107 of the substrate 10 includes a top surface of the first protection layer 105, and the side surface 108 of the substrate 10 includes side surfaces of the first protection layer 105, the core portion 101 and the second protection layer 106.

The semiconductor element 12 is disposed on and electrically connected to the first surface 107 of the substrate 10. In one or more embodiments, the semiconductor element 12 is an integrated circuit (IC) chip, and has an active surface 121 and a backside surface 122. The backside surface 122 of the semiconductor element 12 is adhered to the first surface 107 of the substrate 10 by an inner adhesive material 123. The active surface 121 of the semiconductor element 12 is electrically connected to the bonding pads 1021 of the first patterned circuit 102 adjacent to the first surface 107 of the substrate 10 by multiple bonding wires 124. That is, the semiconductor element 12 is mounted to the substrate 10 by wire bonding. However, the semiconductor element 12 may be mounted to the substrate 10 by flip chip bonding.

The encapsulant 14 is disposed on the first surface 107 of the substrate 10 to cover and protect the semiconductor element 12 and the bonding wires 124. In one or more embodiments, a material of the encapsulant 14 is a molding compound that includes an epoxy resin and fillers dispersed therein. The encapsulant 14 has a first surface 141 (e.g., a top surface) and a side surface 142, which is inclined at an angle different from 90° with respect to the first surface 107 of the substrate 10.

The adhesion layer 16 is disposed on the encapsulant 14, and is conformal with the encapsulant 14. That is, the adhesion layer 16 includes a first portion 161 (e.g., a top portion) and a side portion 162 to cover and in contact with the first surface 141 and the side surface 142 of the encapsulant 14, respectively. In one or more embodiments, a material of the adhesion layer 16 is a solder mask that includes a thermosetting resin or a photosetting (e.g., a photo-sensitive) resin. For example, the material of the adhesion layer 16 includes, or is formed from, a cured photo-sensitive resin that includes an interpenetrating polymer network (IPN) structure. The photo-sensitive resin includes a base resin (e.g., an acrylic resin or epoxy resin) and a photo-initiator. In one or more embodiments, the material of the adhesion layer 16 may be the same as or different from the materials of the first protection layer 105 and the second protection layer 106. In one or more embodiments, the adhesion layer 16 has a substantially consistent thickness, such as in a range of about 10 µm to about 30 µm. The side portion 162 of the adhesion layer 16 is inclined at an angle different from 90° with respect to the first surface 107 of the substrate 10.

The metal cap 18 is attached to the encapsulant 14 by the adhesion layer 16, and the metal cap 18 is conformal with the encapsulant 14. In one or more embodiments, the metal cap 18 includes a first portion 181 (e.g., a top portion), a side portion 182 and an end surface 187. The first portion 181 of the metal cap 18 is attached to the first surface 141 of the encapsulant 14 by the first portion 161 of the adhesion layer 16, and the side portion 182 of the metal cap 18 is attached to the side surface 142 of the encapsulant 14 by the side portion 162 of the adhesion layer 16. The metal cap 18 has a substantially consistent thickness, such as in a range of about 1 µm to about 10 µm; thus, the thickness of the metal cap 18 may be less than the thickness of the adhesion layer 16. The side portion 182 of the metal cap 18 is inclined at an angle different from 90° with respect to the first surface 107 of the substrate 10. The adhesion layer 16 can provide enhanced adhesion between the encapsulant 14 and the metal cap 18. A bottom surface of the metal cap 18 may be a rough surface so as to increase an adhesion force with the adhesion layer 16. Thus, the metal cap 18 can provide enhanced EMI resistance or shielding. In addition, the metal cap 18 can also provide a path for heat dissipation.

The metal cap 18 includes at least one metal layer. As shown in FIG. 1, the metal cap 18 is a single-layered metal structure. However, in one or more embodiments, the metal cap 18 may include two, three or more metal layers. A material of a metal layer is selected from a group consisting of silver, copper, gold, aluminum, zinc, brass, cadmium, nickel, phosphor bronze, iron, an alloy of two or more thereof, steel, stainless steel, and combinations thereof. For example, steel may be 45# steel, and an alloy may be permalloy. It is noted that permalloy is a nickel-iron magnetic alloy, with about 80% nickel and about 20% iron content. Relative magnetic permeabilities of silver, copper, gold, aluminum, zinc, brass, cadmium, nickel and phosphor bronze are about 1 when a frequency is 150 kHz. Thus, silver, copper, gold, aluminum, zinc, brass, cadmium, nickel and phosphor bronze can be used for shielding high frequency electromagnetic waves (e.g., higher than about 300 MHz). Further, relative magnetic permeabilities of iron, 45# steel and stainless steel are about 1000 when the frequency is 150 kHz, and a relative magnetic permeability of permalloy is about 80000 when the frequency is 150 kHz. Thus, iron, 45# steel, stainless steel and permalloy can be used for shielding low frequency electromagnetic waves (e.g., lower than about 300 MHz). In one or more embodiments, expanded options for metals (e.g., including the above-mentioned metals) can be used for the metal cap 18 because the metal cap 18 may be formed by physical techniques, such as punching, rather than by chemical techniques, such as coating, plating or sputtering.

As illustrated in FIG. 1, since the metal cap 18 is formed by punching and then adhered to the encapsulant 14, a gap 188 may be formed between the end surface 187 of the metal cap 18 and the first surface 107 of the substrate 10. That is, the entire end surface 187 of the metal cap 18 may not fully contact the first surface 107 of the substrate 10. In comparison, if the metal cap 18 is formed by chemical techniques such as coating, plating or sputtering, the entire end surface 187 of the metal cap 18 will fully contact the first surface 107 of the substrate 10; thus, there would be no gap between the end surface 187 of the metal cap 18 and the first surface 107 of the substrate 10.

Figure 3:
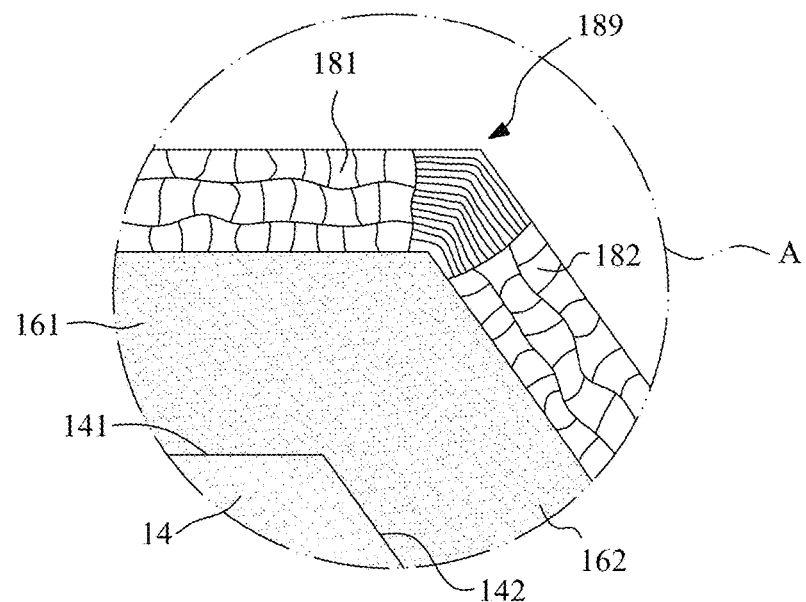
FIG. 3 illustrates an enlarged view of a region "A" of the semiconductor package structure of FIG. 1.

FIG. 3 illustrates an enlarged view of a region "A" of the semiconductor package structure 1 of FIG. 1. Since the metal cap 18 is formed by punching, a grain shape of a metal-containing material of the metal cap 18 at its corner 189 (an intersection between the first portion 181 and the side portion 182) differs from a grain shape of the metal-containing material of the metal cap 18 at the first portion 181 or the side portion 182. As shown in FIG. 3, the grain shape of the metal-containing material of the metal cap 18 at the first portion 181 or the side portion 182 is generally rounded or polygonal, and an aspect ratio of constituent grains is about 0.5 to about 1.5. In addition, the grain shape of the metal-containing material of the metal cap 18 at the corner 189 is generally in the shape of a thin platelet, and an aspect ratio of constituent grains is greater than about 2.0, such as about 4.0 or greater, about 6.0 or greater, or even up to about 10 or greater. This is because the metal-containing material of the metal cap 18 at the corner 189 is elongated and compressed during a punching process.

Figure 4:
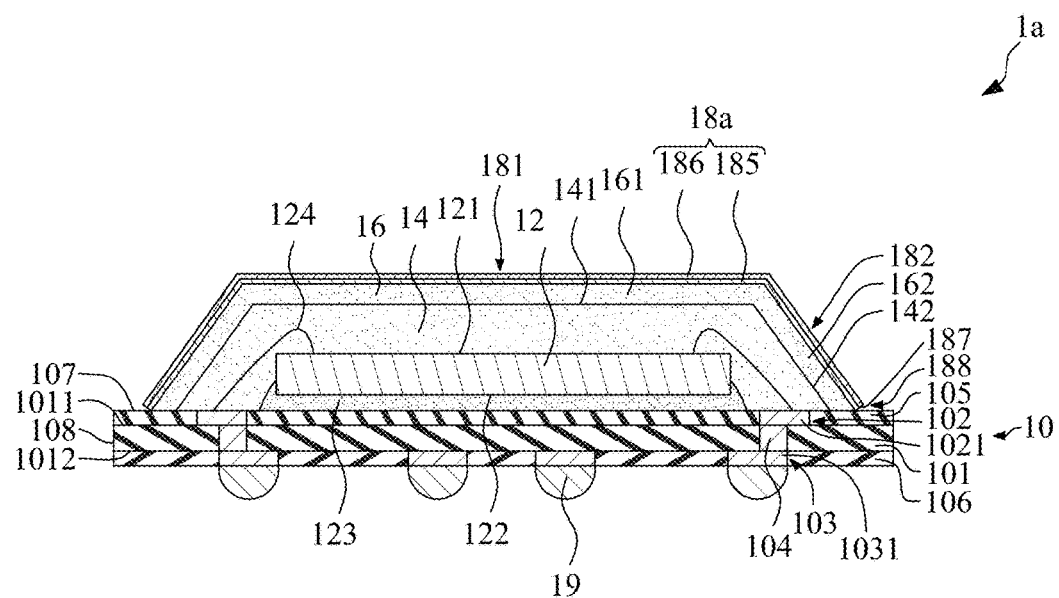
FIG. 4 illustrates a cross-sectional view of a semiconductor package structure according to some embodiments of the present disclosure.

FIG. 4 illustrates a cross-sectional view of a semiconductor package structure 1a according to some embodiments of the present disclosure. The semiconductor package structure 1a is similar to the semiconductor package structure 1 as shown in FIG. 1, except that a metal cap 18a includes two laminated metal layers, namely a first metal layer 185 and a second metal layer 186. The first metal layer 185 is disposed between the second metal layer 186 and the adhesion layer 16. In one or more embodiments, a material of the first metal layer 185 is used for shielding high frequency electromagnetic waves (e.g., higher than about 300 MHz), such as silver, copper, gold, aluminum, zinc, brass, cadmium, nickel, phosphor bronze, or an alloy or other combination thereof. A material of the second metal layer 186 is used for shielding low frequency electromagnetic waves (e.g., lower than about 300 MHz), such as iron, 45# steel, stainless steel, permalloy, or an alloy or other combination thereof. Therefore, the metal cap 18a can shield high frequency electromagnetic waves (e.g., higher than about 300 MHz) and low frequency electromagnetic waves (e.g., lower than about 300 MHz). Shielding capabilities of the first metal layer 185 and the second metal layer 186 also may be reversed.

Figure 5:
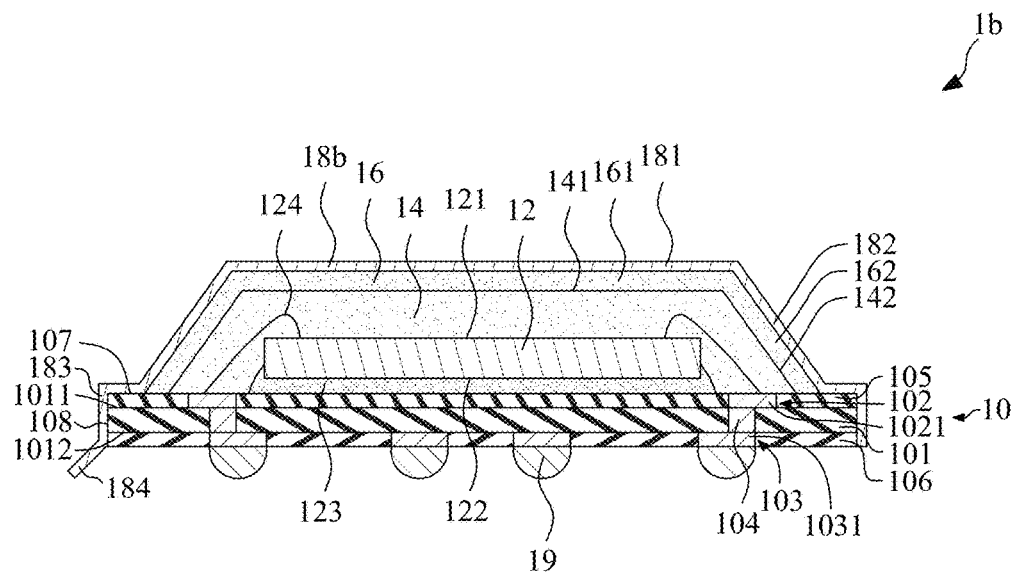
FIG. 5 illustrates a cross-sectional view of a semiconductor package structure according to some embodiments of the present disclosure.

FIG. 5 illustrates a cross-sectional view of a semiconductor package structure 1b according to some embodiments of the present disclosure. The semiconductor package structure 1b is similar to the semiconductor package structure 1 as shown in FIG. 1, except that a metal cap 18b further includes an extending portion 183 and a grounding pin 184. The extending portion 183 extends from the side portion 182 of the metal cap 18b horizontally and downwardly to cover a periphery of the first surface 107 and the side surface 108 of the substrate 10. That is, the extending portion 183 is attached to the first surface 107 and the side surface 108 of the substrate 10 so as to enhance the effect of EMI resistance or shielding and an attachment force between the metal cap 18b and the substrate 10. It is noted that there may be or may not be a portion of the adhesion layer 16 extending between the extending portion 183 of the metal cap 18b and the substrate 10. The grounding pin 184 connects the extending portion 183 for grounding. In one or more embodiments, grounding circuits of the first patterned circuit 102 and the second patterned circuit 103 may be electrically connected to the extending portion 183 and the grounding pin 184.

Figure 6:
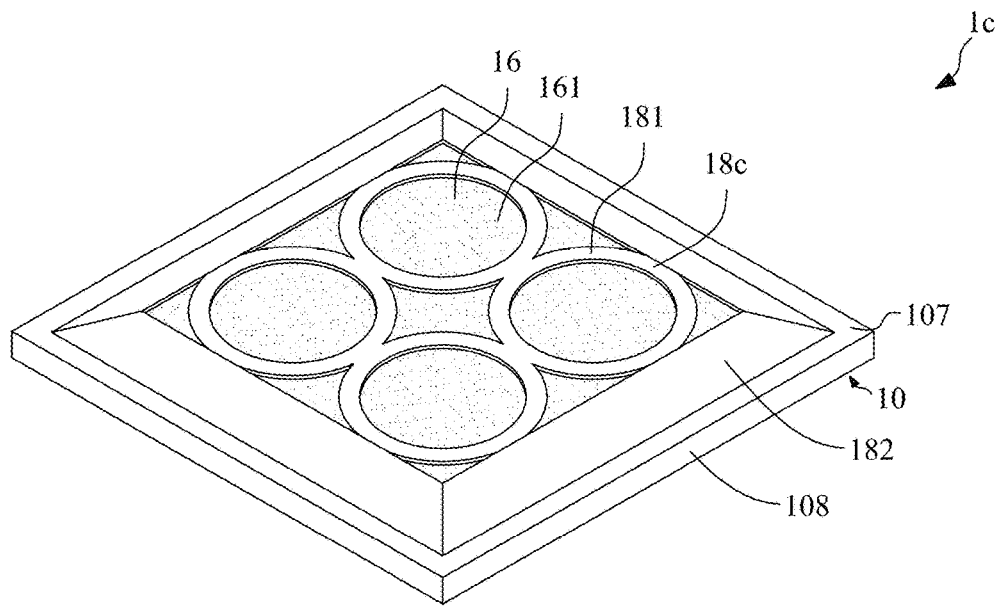
FIG. 6 illustrates a perspective view of a semiconductor package structure according to some embodiments of the present disclosure.

FIG. 6 illustrates a perspective view of a semiconductor package structure 1c according to some embodiments of the present disclosure. The semiconductor package structure 1c is similar to the semiconductor package structure 1 as shown in FIG. 1, except that the first portion 181 of a metal cap 18c has a pattern or is patterned, and the pattern includes multiple rings connected to each other so as to define openings exposing portions of the adhesion layer 16. According to experimental results, since an area of the first portion 181 of the metal cap 18c is reduced, a warpage of the semiconductor package structure 1c is reduced during a reflow process. In addition, if any electrical element or semiconductor element does not require shielding, such electrical element or semiconductor element can be disposed under an exposed portion of the adhesion layer 16.

Figure 7:
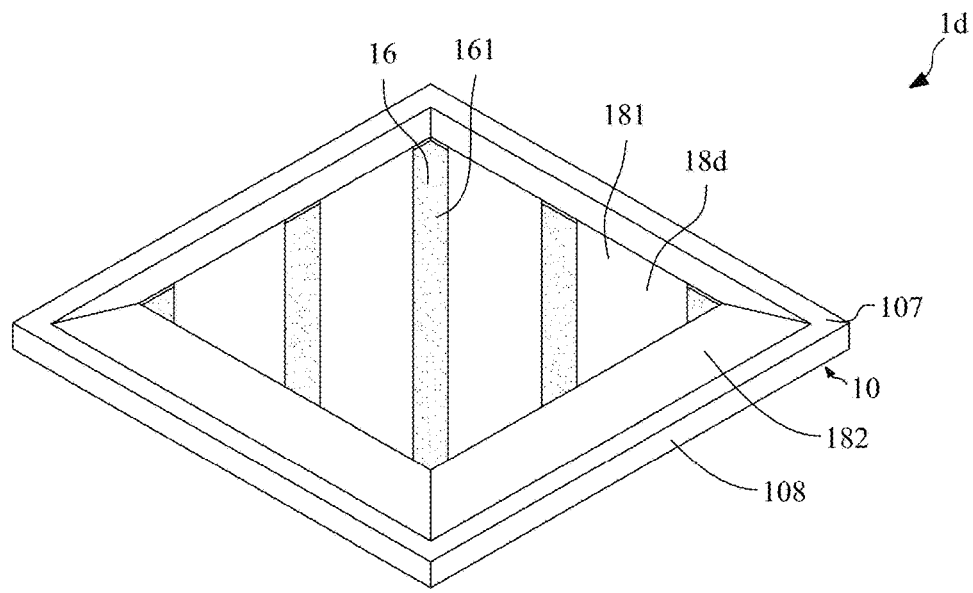
FIG. 7 illustrates a perspective view of a semiconductor package structure according to some embodiments of the present disclosure.

FIG. 7 illustrates a perspective view of a semiconductor package structure 1d according to some embodiments of the present disclosure. The semiconductor package structure 1d is similar to the semiconductor package structure 1c as shown in FIG. 6, except that a pattern of the first portion 181 of a metal cap 18d includes multiple strips substantially parallel with each other. The strips are spaced apart so as to define openings exposing portions of the adhesion layer 16.

Figure 8:
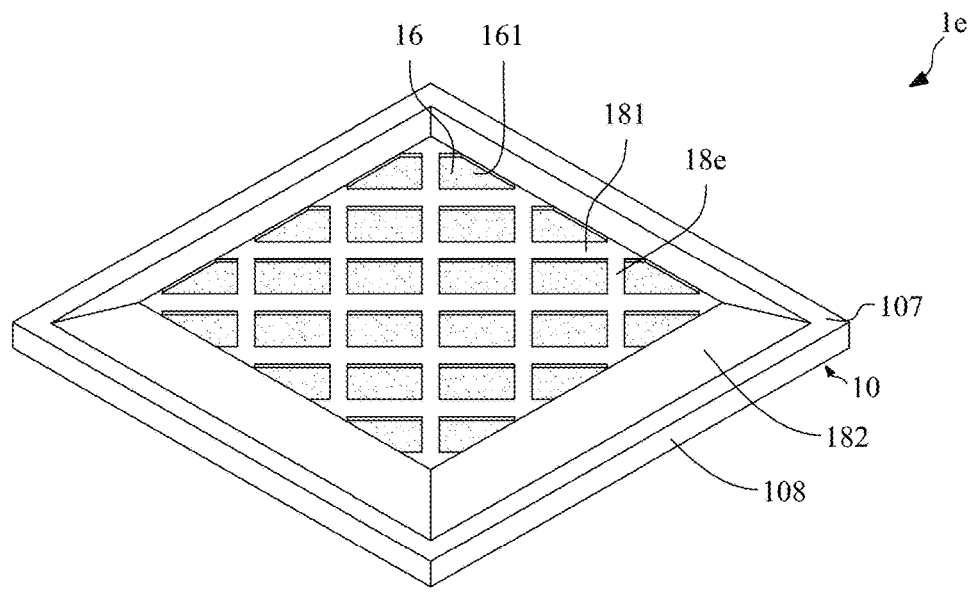
FIG. 8 illustrates a perspective view of a semiconductor package structure according to some embodiments of the present disclosure.

FIG. 8 illustrates a perspective view of a semiconductor package structure 1e according to some embodiments of the present disclosure. The semiconductor package structure 1e is similar to the semiconductor package structure 1c as shown in FIG. 6, except that a pattern of the first portion 181 of a metal cap 18e includes a plurality of strips crossing each other to form a grid. Openings within the grid expose portions of the adhesion layer 16.

Figure 9:
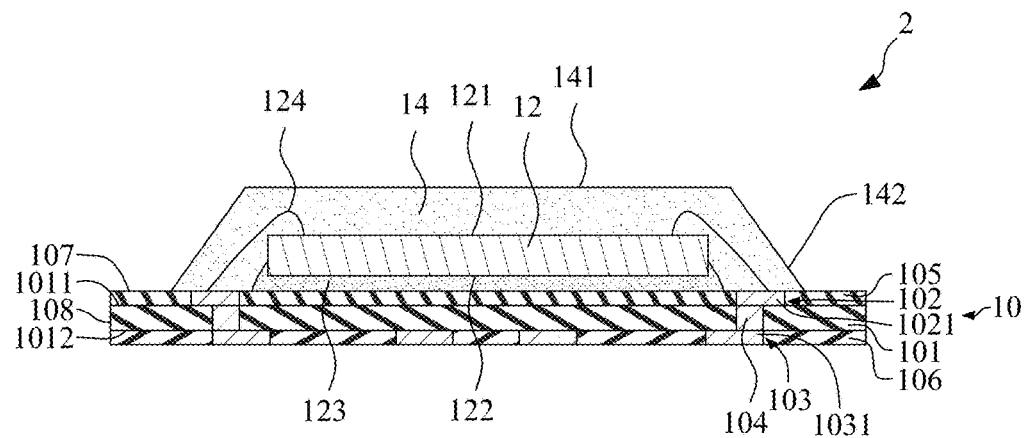
FIG. 9, FIG. 10, FIG. 11, FIG. 12 and FIG. 13 illustrate a method for manufacturing a semiconductor package structure according to some embodiments of the present disclosure.

FIGS. 9-13 illustrate a method for manufacturing a semiconductor package structure according to some embodiments of the present disclosure. Referring to FIG. 9, the substrate 10 with at least one semiconductor element 12 disposed thereon is provided. In one or more embodiments, the substrate 10 is a package substrate, and includes the core portion 101, the first patterned circuit 102, the second patterned circuit 103, the conductive vias 104, the first protection layer 105 and the second protection layer 106. As shown in FIG. 9, the substrate 10 has the first surface 107 and the side surface 108. The semiconductor element 12 is disposed on and electrically connected to the first surface 107 of the substrate 10. In one or more embodiments, the semiconductor element 12 is an IC chip, and has the active surface 121 and the backside surface 122. The backside surface 122 of the semiconductor element 12 is adhered to the first surface 107 of the substrate 10 by the inner adhesive material 123. The active surface 121 of the semiconductor element 12 is electrically connected to the bonding pads 1021 of the first patterned circuit 102 adjacent to the first surface 107 of the substrate 10 by the bonding wires 124. That is, the semiconductor element 12 is mounted to the substrate 10 by wire bonding. However, the semiconductor element 12 may be mounted to the substrate 10 by flip chip bonding. Then, the encapsulant 14 is formed on the first surface 107 of the substrate 10 to cover and protect the semiconductor element 12 and the bonding wires 124. The encapsulant 14 is cured, and includes the first surface 141 and the side surface 142. As a result, a package structure 2 is obtained.

Figure 10:
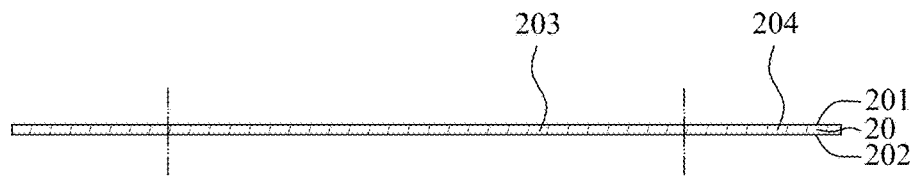
Figure 11:
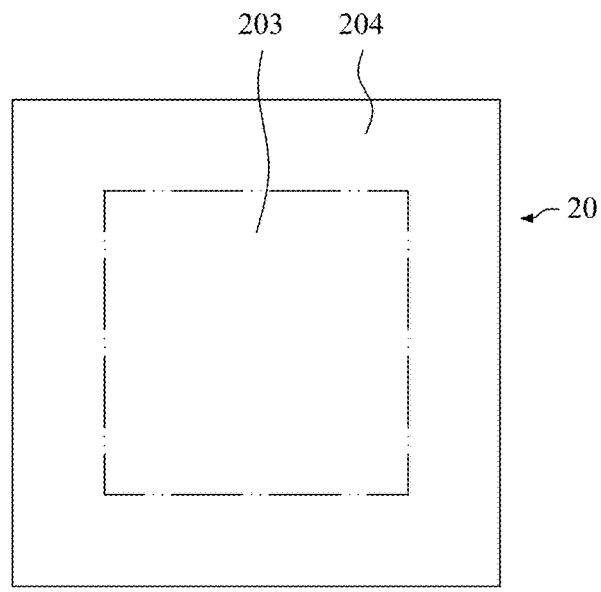

Referring to FIG. 10, a metal foil 20 is provided. Referring to FIG. 11, a top view of the metal foil 20 is shown. As shown in FIG. 10, the metal foil 20 is a single-layered metal structure. However, in one or more embodiments, the metal foil 20 may include two, three or more metal layers. A material of a metal layer is selected from a group consisting of silver, copper, gold, aluminum, zinc, brass, cadmium, nickel, phosphor bronze, iron, an alloy of two or more thereof, steel, stainless steel, and combinations thereof. The metal foil 20 has a first surface 201 and a second surface 202, and includes a first region 203 (e.g., a center region) and a second region 204 (e.g., a periphery region). The first region 203 of the metal foil 20 corresponds to the first surface 141 of the encapsulant 14. The second region 204 of the metal foil 20 surrounds the first region 203, and corresponds to the side surface 142 of the encapsulant 14. The second surface 202 of the metal foil 20 may be treated to be a rough surface so as to increase an adhesion force with the adhesion layer 16 (see FIG. 12).

Figure 12:
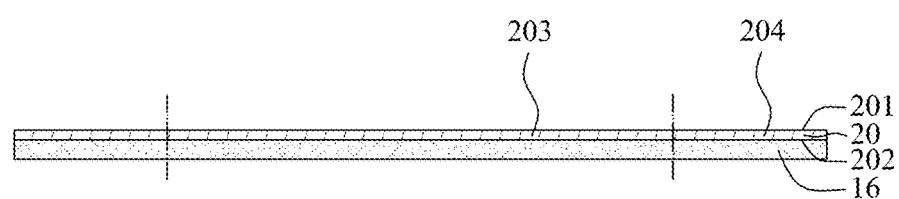

Referring to FIG. 12, a material of the adhesion layer 16 is applied on the second surface 202 of the metal foil 20. In one or more embodiments, the material of the adhesion layer 16 is a solder mask that includes a thermosetting resin or a photosetting resin. For example, the material of the adhesion layer 16 includes a photo-sensitive resin that includes a base resin (e.g., an acrylic resin or epoxy resin) and a photo-initiator. At this stage, the adhesion layer 16 is not cured. In one or more embodiments, the adhesion layer 16 may be formed by scraping.

Figure 13:
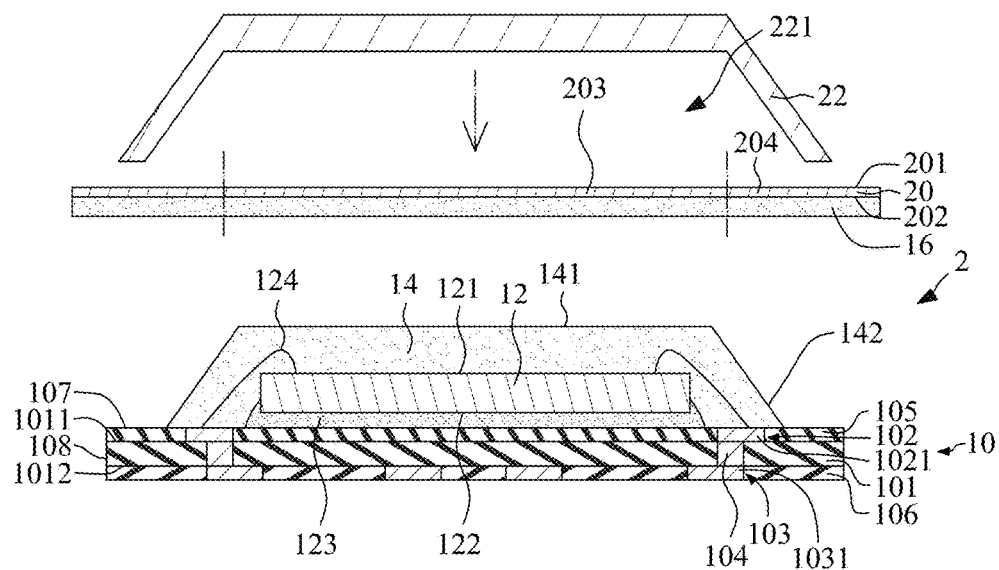

Referring to FIG. 13, the metal foil 20 and the adhesion layer 16 are disposed above the encapsulant 14 of the package structure 2, with the adhesion layer 16 facing the encapsulant 14. Then, the metal foil 20 is punched or pressed to the encapsulant 14 and the substrate 10 by a punching tool 22 above the metal foil 20, so as to form the metal cap 18 (see FIG. 1) attached to the encapsulant 14 by the adhesion layer 16, and the metal cap 18 is conformal with the encapsulant 14. It is noted that the punching tool 22 defines a first accommodating space 221 to accommodate the encapsulant 14 during the punching process. Then, the solder balls 19 are formed on the respective ball pads 1031 (see FIG. 1). Thus, the semiconductor package structure 1 of FIG. 1 is obtained, wherein the first region 203 and the second region 204 of the metal foil 20 become the first portion 181 and the side portion 182 of the metal cap 18, respectively. Since the metal cap 18 is formed by punching, the grain shape of the metal-containing material of the metal cap 18 at its corner 189 differs from the grain shape of the metal-containing material of the metal cap 18 at the first portion 181 or the side portion 182 as stated above. Optionally, the semiconductor package structure 1 of FIG. 1 may be formed by baking or heating at about 175° C. for about four hours to cure the adhesion layer 16.

Because the metal cap 18 is formed by a physical technique such as punching, rather than by chemical techniques such as coating, plating or sputtering, the method presents a reduced pollution concern. Further, expanded options for metals can be used for the metal cap 18. In addition, an uniformity of a thickness of the metal cap 18 can be readily controlled.

Figure 14:
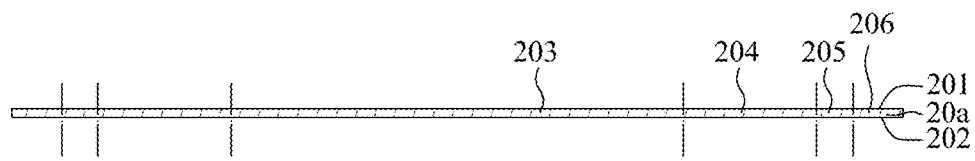
FIG. 14, FIG. 15, FIG. 16 and FIG. 17 illustrate a method for manufacturing a semiconductor package structure according to some embodiments of the present disclosure.
Figure 15:
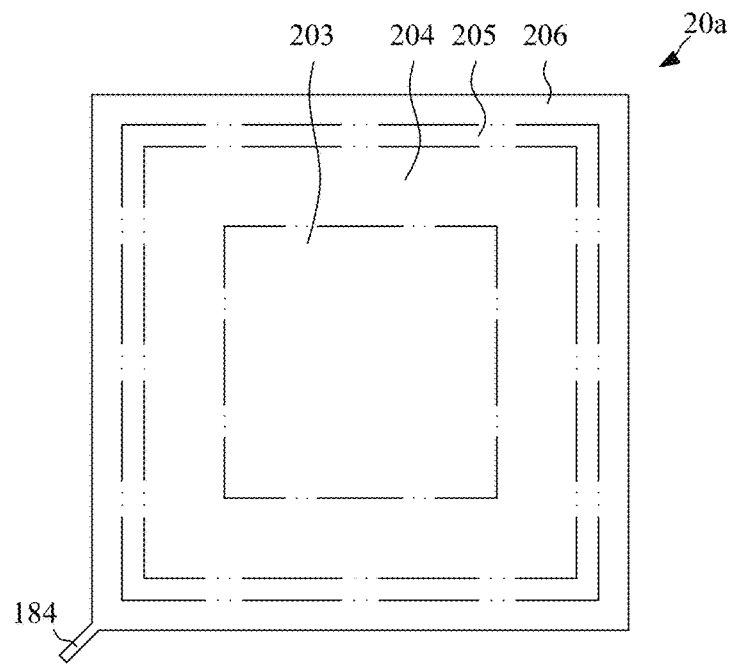

FIGS. 14-17 illustrate a method for manufacturing a semiconductor package structure according to some embodiments of the present disclosure. The initial stage of the method is the same as the stage illustrated in FIG. 9, and FIG. 14 is a stage subsequent to FIG. 9. Referring to FIG. 14, a metal foil 20a is provided. Referring to FIG. 15, a top view of the metal foil 20a is shown. The metal foil 20a is similar to the metal foil 20 of FIGS. 10 and 11 except that the metal foil 20a further includes a third region 205, a fourth region 206 and a grounding pin 184. The third region 205 of the metal foil 20a surrounds the second region 204, and corresponds to the periphery of the first surface 107 of the substrate 10. The fourth region 206 of the metal foil 20a surrounds the third region 205, and corresponds to the side surface 108 of the substrate 10. The grounding pin 184 connects to the fourth region 206.

Figure 16:
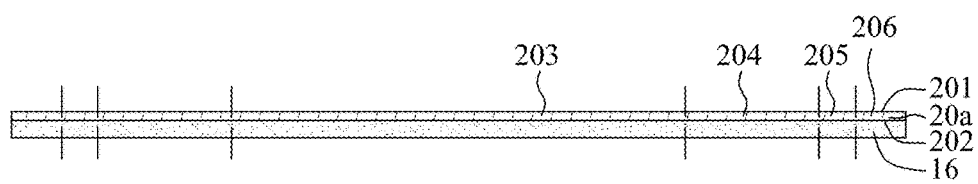

Referring to FIG. 16, a material of the adhesion layer 16 is applied on the second surface 202 of the metal foil 20a.

Figure 17:
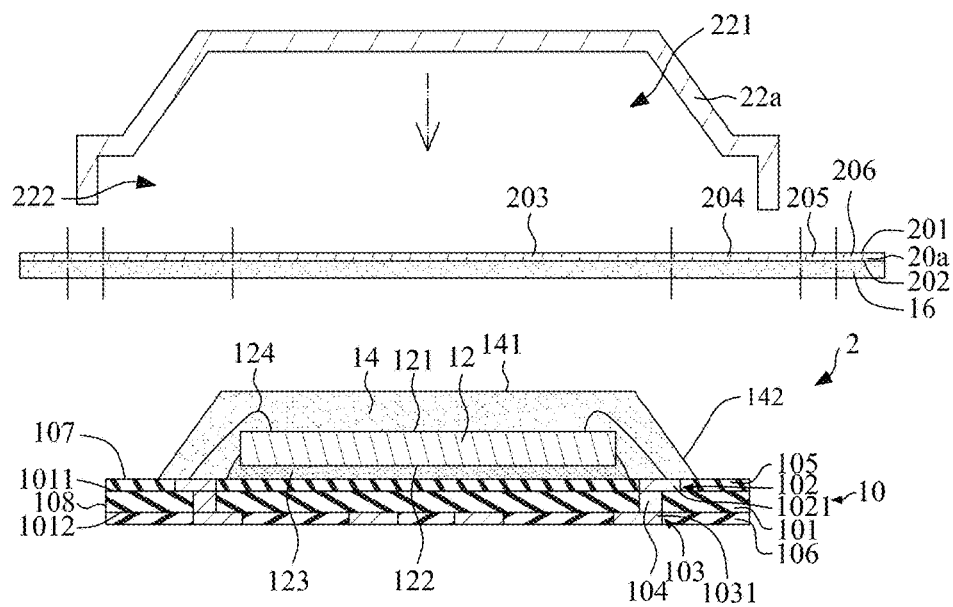

Referring to FIG. 17, the metal foil 20a and the adhesion layer 16 are disposed above the encapsulant 14 of the package structure 2, with the adhesion layer 16 facing the encapsulant 14. Then, the metal foil 20a is punched or pressed to the encapsulant 14 and the substrate 10 by a punching tool 22a above the metal foil 20a, so as to form the metal cap 18b (see FIG. 5) attached to the encapsulant 14 by the adhesion layer 16, and the metal cap 18b is conformal with the encapsulant 14. It is noted that the punching tool 22a defines a first accommodating space 221 to accommodate the encapsulant 14 and a second accommodating space 222 to accommodate the substrate 10 during the punching process. Then, the solder balls 19 are formed on the respective ball pads 1031 (see FIG. 5). Thus, the semiconductor package structure 1b of FIG. 5 is obtained, wherein the third region 205 and the fourth region 206 of the metal foil 20a become the extending portion 183 of the metal cap 18b.

Figure 18:
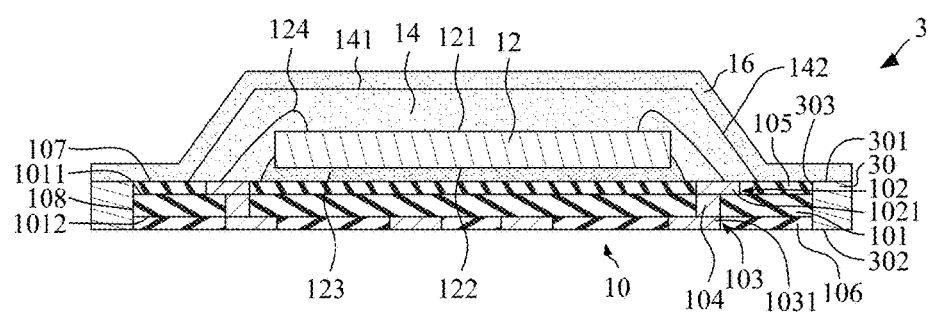
FIG. 18 and FIG. 19 illustrate a method for manufacturing a semiconductor package structure according to some embodiments of the present disclosure.
Figure 19:
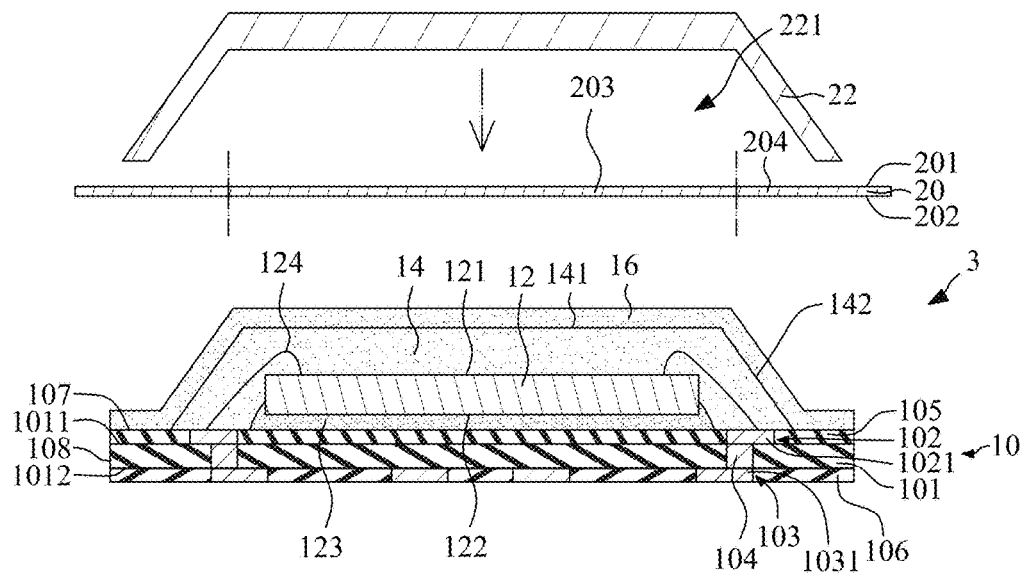

FIGS. 18-19 illustrate a method for manufacturing a semiconductor package structure according to some embodiments of the present disclosure. The initial stage of the method is the same as the stage illustrated in FIG. 9, and FIG. 18 is a stage subsequent to FIG. 9. Referring to FIG. 18, a mask 30 is provided. The mask 30 has a first surface 301 and a second surface 302, and defines an opening 303. Then, the substrate 10 is disposed in the opening 303 of the mask 30. In one or more embodiments, the side surface 108 of the substrate 10 may contact a sidewall of the opening 303 of the mask 30, and the first surface 107 of the substrate 10 may be substantially coplanar with the first surface 301 of the mask 30. Then, a material of the adhesion layer 16 is applied on the first surface 141 and the side surface 142 of the encapsulant 14 and the first surface 301 of the mask 30. As a result, a package structure 3 is obtained. At this stage, the adhesion layer 16 is not cured. In one or more embodiments, the adhesion layer 16 may be formed by scraping.

Referring to FIG. 19, the mask 30 is removed, and the metal foil 20 is provided. The metal foil 20 is disposed above the encapsulant 14 and the adhesion layer 16 of the package structure 3. Then, the metal foil 20 is punched or pressed to the adhesion layer 16 and the substrate 10 by the punching tool 22 above the metal foil 20, so as to form the metal cap 18 (see FIG. 1) attached to the encapsulant 14 by the adhesion layer 16, and the metal cap 18 is conformal with the encapsulant 14. Then, the solder balls 19 are formed on the respective ball pads 1031 (see FIG. 1). Thus, the semiconductor package structure 1 of FIG. 1 is obtained. Optionally, the semiconductor package structure 1 of FIG. 1 may be formed by baking at about 175° C. for about four hours to cure the adhesion layer 16.

Figure 20:
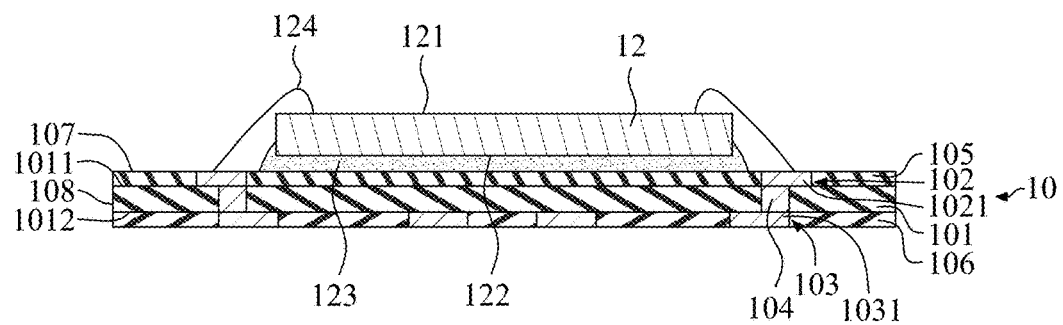
FIG. 20, FIG. 21 and FIG. 22 illustrate a method for manufacturing a semiconductor package structure according to some embodiments of the present disclosure.
Figure 21:
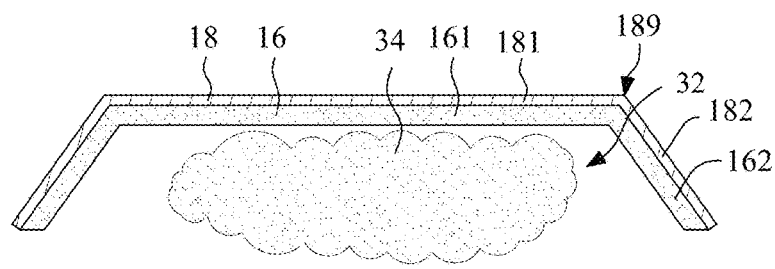
Figure 22:
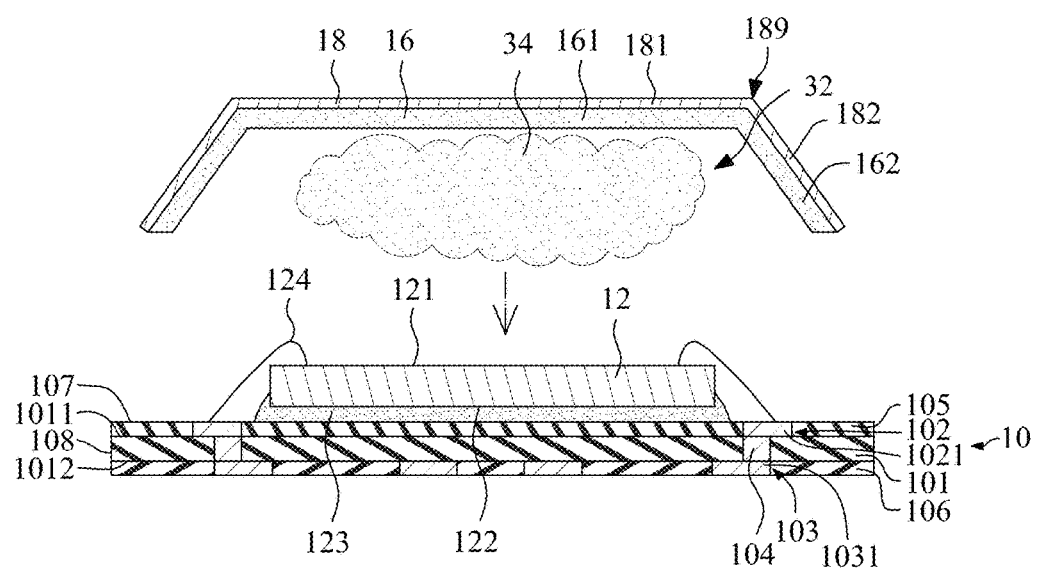

FIGS. 20-22 illustrate a method for manufacturing a semiconductor package structure according to some embodiments of the present disclosure. Referring to FIG. 20, the substrate 10 with at least one semiconductor element 12 disposed thereon is provided. The backside surface 122 of the semiconductor element 12 is adhered to the first surface 107 of the substrate 10 by the inner adhesive material 123. The active surface 121 of the semiconductor element 12 is electrically connected to the bonding pads 1021 of the first patterned circuit 102 adjacent to the first surface 107 of the substrate 10 by the bonding wires 124.

Referring to FIG. 21, the metal cap 18 is provided. In one or more embodiments, the metal cap 18 is formed from a metal foil by punching, and includes the first portion 181, the side portion 182 and the corner 189. The metal cap 18 defines a cavity 32, and a material of the adhesion layer 16 is disposed on the metal cap 18 in the cavity 32. Then, an encapsulant material 34 is dispensed in the cavity 32 by, for example, injection.

Referring to FIG. 22, the substrate 10 is disposed adjacent to the metal cap 18, with the semiconductor element 12 and the bonding wires 124 facing the encapsulant material 34. Then, the substrate 10 is pressed to the metal cap 18, so that the encapsulant material 34 fills the cavity 32 and covers the semiconductor element 12 and the bonding wires 124 to form the encapsulant 14 (see FIG. 1). Meanwhile, the metal cap 18 is attached to the encapsulant 14 by the adhesion layer 16, and the metal cap 18 is conformal with the encapsulant 14. Then, the solder balls 19 are formed on the respective ball pads 1031 (see FIG. 1). Thus, the semiconductor package structure 1 of FIG. 1 is obtained. Optionally, the semiconductor package structure 1 of FIG. 1 may be formed by baking at about 175° C. for about four hours to cure the adhesion layer 16 and the encapsulant 14.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a thickness being "substantially" consistent can refer to a standard deviation of less than or equal to ±10% of an average thickness, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   (a) providing a substrate with a semiconductor element disposed thereon; and
   (b) providing an encapsulant, an adhesion layer and a metal cap to form the semiconductor package structure, wherein the encapsulant covers the semiconductor element, the adhesion layer is disposed on the encapsulant, the metal cap is attached to the encapsulant by the adhesion layer, and the metal cap is conformal with the encapsulant;

wherein (b) includes:
(b1) forming the encapsulant on the substrate to cover the semiconductor element;
(b2) providing a metal foil;
(b3) forming the adhesion layer on a surface of the metal foil;
(b4) disposing the metal foil above the encapsulant, wherein the adhesion layer faces the encapsulant; and
(b5) punching the metal foil to the encapsulant, so as to form the metal cap attached to the encapsulant by the adhesion layer, such that the metal cap is conformal with the encapsulant.

2. The method according to claim 1, wherein, after (b1), the method further includes:
(b11) curing the encapsulant.

3. A method for manufacturing a semiconductor package structure, comprising:
(a) providing a substrate with a semiconductor element disposed thereon; and
(b) providing an encapsulant, an adhesion layer and a metal cap to form the semiconductor package structure, wherein the encapsulant covers the semiconductor element, the adhesion layer is disposed on the encapsulant, the metal cap is attached to the encapsulant by the adhesion layer, and the metal cap is conformal with the encapsulant;
wherein (b) includes:
(b1) forming the encapsulant on the substrate to cover the semiconductor element;
(b2) curing the encapsulant;
(b3) forming the adhesion layer on a surface of the encapsulant;
(b4) providing a metal foil;
(b5) disposing the metal foil above the encapsulant and the adhesion layer; and
(b6) punching the metal foil to the encapsulant, so as to form the metal cap attached to the encapsulant by the adhesion layer, such that the metal cap is conformal with the encapsulant.

4. The method according to claim 3, wherein, after (b2), the method further includes:
(b21) providing a mask defining an opening; and
(b22) disposing the substrate in the opening of the mask;
wherein, after (b3), the method further includes:
(b31) removing the mask.

5. A method for manufacturing a semiconductor package structure, comprising:
(a) providing a substrate with a semiconductor element disposed thereon; and
(b) providing an encapsulant, an adhesion layer and a metal cap to form the semiconductor package structure by performing operations that comprise:
(b1) providing the metal cap, wherein the metal cap defines a cavity, and the adhesion layer is disposed on the metal cap and in the cavity;
(b2) dispensing an encapsulant material in the cavity;
(b3) disposing the substrate adjacent to the metal cap, such that the semiconductor element faces the encapsulant material; and
(b4) pressing the substrate to the metal cap, so that the encapsulant material covers the semiconductor element to form the encapsulant, the metal cap is attached to the encapsulant by the adhesion layer, and the metal cap is conformal with the encapsulant,
wherein the encapsulant covers the semiconductor element, the adhesion layer is disposed on the encapsulant, the metal cap is attached to the encapsulant by the adhesion layer, and the metal cap is conformal with the encapsulant.

6. The method according to claim 5, wherein a material of the adhesion layer is a solder mask, the metal cap includes at least one metal layer, a material of the metal layer is selected from a group consisting of silver, copper, gold, aluminum, zinc, brass, cadmium, nickel, phosphor bronze, iron, steel, stainless steel, and combinations thereof.

7. The method according to claim 5, further comprising:
(c) baking the semiconductor package structure.

8. A semiconductor package structure, comprising:
a substrate having a first surface;
a semiconductor element disposed on the first surface of the substrate;
an encapsulant covering the semiconductor element;
an adhesion layer disposed on the encapsulant; and
a metal cap attached to the encapsulant by the adhesion layer,
wherein the metal cap is conformal with the encapsulant and contacts the first surface of the substrate, and
wherein the encapsulant includes a first surface and a side surface, the adhesion layer includes a first portion and a side portion, the metal cap includes a first portion and a side portion, the first portion of the metal cap is attached to the first surface of the encapsulant by the first portion of the adhesion layer, and the side portion of the metal cap is attached to the side surface of the encapsulant by the side portion of the adhesion layer.

9. The semiconductor package structure according to claim 8, wherein the metal cap includes at least two metal layers, and materials of the metal layers are different.

10. The semiconductor package structure according to claim 8, wherein a material of the adhesion layer includes an interpenetrating polymer network structure.

11. The semiconductor package structure according to claim 8, wherein the first portion of the metal cap defines an opening to expose a portion of the adhesion layer.

12. The semiconductor package structure according to claim 8, wherein the adhesion layer is formed from a thermosetting resin or a photosetting resin.

13. The semiconductor package structure according to claim 8, wherein a material of the encapsulant is a molding compound.

14. The semiconductor package structure according to claim 8, wherein a material of the adhesion layer is a solder mask.

15. The semiconductor package structure according to claim 8, wherein the metal cap includes an extending portion attached to a side surface of the substrate.

16. The semiconductor package structure according to claim 15, wherein the metal cap includes a grounding pin, and the grounding pin connects to the extending portion.

17. The semiconductor package structure according to claim 8, wherein the metal cap includes at least one metal layer.

18. The semiconductor package structure according to claim 17, wherein a material of the metal layer is selected from a group consisting of silver, copper, gold, aluminum, zinc, brass, cadmium, nickel, phosphor bronze, iron, steel, stainless steel, and combinations thereof.

* * * * *